(12) United States Patent
Mastromauro et al.

(10) Patent No.: US 12,288,835 B2
(45) Date of Patent: Apr. 29, 2025

(54) ELECTRONIC DEVICE COMPRISING AN OPTICAL CHIP AND METHOD OF FABRICATION

(71) Applicant: STMicroelectronics (Grenoble 2) SAS, Grenoble (FR)

(72) Inventors: Nicolas Mastromauro, Lumbin (FR); Karine Saxod, Les Marches (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 1010 days.

(21) Appl. No.: 17/145,929

(22) Filed: Jan. 11, 2021

(65) Prior Publication Data

US 2021/0135072 A1   May 6, 2021

Related U.S. Application Data

(62) Division of application No. 16/572,979, filed on Sep. 17, 2019, now Pat. No. 10,923,638.

(30) Foreign Application Priority Data

Sep. 25, 2018   (FR) ...................................... 1858736

(51) Int. Cl.
*H01L 33/58* (2010.01)
*H01L 33/48* (2010.01)
(Continued)

(52) U.S. Cl.
CPC ............ *H01L 33/58* (2013.01); *H01L 33/483* (2013.01); *H01L 33/54* (2013.01); *H01L 33/62* (2013.01)

(58) Field of Classification Search
CPC ....... H01L 33/58; H01L 33/483; H01L 33/54; H01L 33/62
See application file for complete search history.

(56) References Cited

U.S. PATENT DOCUMENTS 10,923,638 B2    2/2021  Mastromauro et al.
12,066,678 B2 *  8/2024  Mastromauro ... H01L 31/02325
(Continued)

FOREIGN PATENT DOCUMENTS

WO    2008093463 A1    8/2008

OTHER PUBLICATIONS

INPI Search Report and Written Opinion for FR 1858736 dated Jun. 11, 2019 (9 pages).

*Primary Examiner* — Fernando L Toledo
*Assistant Examiner* — Jahae Kim
(74) *Attorney, Agent, or Firm* — Crowe & Dunlevy LLC

(57) ABSTRACT

An electronic device includes a carrier substrate having a front face and an electronic chip mounted on the front face. An encapsulation cover is mounted above the front face and bounds a chamber in which the chip is situated. A front opening is provided in front of an optical component of the chip. An optical element, designed to allow light to pass, is mounted on the cover in a position which covers the front opening of the cover. The optical element includes a central region designed to deviate light and a positioning pattern that is visible through the front opening. An additional mask is mounted on the encapsulation cover in a position which extends in front of the optical element. A local opening of the additional mask is situated in front of the optical component.

4 Claims, 1 Drawing Sheet

(51) Int. Cl.
*H01L 33/54* (2010.01)
*H01L 33/62* (2010.01)

(56) References Cited

U.S. PATENT DOCUMENTS

| | | |
|---|---|---|
| 2004/0061799 A1 | 4/2004 | Atarashi et al. |
| 2005/0035421 A1* | 2/2005 | Kayanuma ............. H04N 23/57 |
| | | 257/E31.127 |
| 2005/0099659 A1 | 5/2005 | Wu et al. |
| 2006/0006486 A1 | 1/2006 | Seo et al. |
| 2006/0016973 A1 | 1/2006 | Yang et al. |
| 2007/0108561 A1 | 5/2007 | Webster et al. |
| 2007/0126081 A1 | 6/2007 | Webster et al. |
| 2009/0266988 A1 | 10/2009 | Honda et al. |
| 2010/0053388 A1 | 3/2010 | Kobayashi et al. |
| 2011/0086461 A1 | 4/2011 | Bolis |
| 2017/0052063 A1 | 2/2017 | Lai et al. |
| 2022/0171057 A1* | 6/2022 | Knorr ................... G01S 7/4814 |

\* cited by examiner

ELECTRONIC DEVICE COMPRISING AN OPTICAL CHIP AND METHOD OF FABRICATION

CROSS-REFERENCE TO RELATED APPLICATION

This application is a divisional of U.S. application patent Ser. No. 16/572,979, filed Sep. 17, 2019, which claims the priority benefit of French Application for Patent No. 1858736, filed on Sep. 25, 2018, the contents of which are hereby incorporated by reference in their entireties to the maximum extent allowable by law.

TECHNICAL FIELD

The present invention relates to the field of electronic devices which comprise electronic chips equipped with optical components designed to emit/receive light.

SUMMARY

According to one embodiment, an electronic device is provided which comprises: a substrate wafer which has a front mounting face; an electronic chip mounted on the front mounting face of the substrate wafer and having, in its front face, an optical component; an encapsulation cover of the chip which is mounted on top of the front face of the substrate wafer, which bounds a chamber within which the chip is situated and which has a front opening situated in front of the optical component of the chip; and an optical element, designed to allow light to pass, which is mounted on the cover and which covers the opening of the cover.

The electronic device furthermore comprises an additional mask which is mounted on the cover, which extends in front of the optical element and which has a local opening situated in front of the optical component of the chip.

Thus, by virtue of the additional mask having a local opening, the field of the light radiation is more readily controlled. Furthermore, the assembly is facilitated and precise.

The local opening of the additional mask may be smaller than the front opening of the cover.

The optical element may comprise a central part designed to deviate the light and a positioning pattern.

The optical element may comprise a base wafer and a back layer including a central part designed to deviate the light and a positioning pattern being visually detectable through the front opening of the encapsulation cover.

The additional mask may be mounted above a front edge of the cover situated around and separated from the optical element.

The optical element may be mounted above a front face of a shoulder of the cover surrounding the front opening of the cover.

The electronic device may comprise another electronic chip mounted on the front mounting face of the substrate wafer and having an optical component in its front face.

The encapsulation cover may bound another chamber within which the other chip is situated and has another front opening situated in front of the optical component of the other chip.

Another optical element, through which light is able to pass, may be mounted on the cover and covers the other opening of the cover.

The additional mask may have another local opening situated in front of the optical component of the other chip.

A method of fabricating an electronic device is also provided, which comprises the following: Provide, on the one hand, a substrate wafer on a front face of which at least one electronic chip is mounted comprising an optical component and, on the other hand, an encapsulation cover having a front opening and an optical element through which light is able to pass; mount the optical element on the encapsulation cover, in front of the front opening; mount an additional mask on the encapsulation cover, in front of the optical element, the additional mask having a local opening; and mount the encapsulation cover on top of the front face of the substrate wafer, in a position such that the chip is situated within a chamber bounded by the encapsulation cover and such that the optical element is in front of the optical component of the chip, the optical axes of the optical component of the chip and of the optical element and the axis of the local opening of the additional mask being situated on a common optical axis.

The method may comprise: placing the encapsulation cover equipped with the optical element and with the additional mask in a reference position; detecting a positioning pattern of the optical element through the front opening of the encapsulation cover with respect to a position of the carrier substrate or of the chip mounted on the carrier substrate; moving and mounting the encapsulation cover on top of the carrier substrate, from the reference position and according to a movement and mounting program.

BRIEF DESCRIPTION OF THE DRAWINGS

Electronic devices will now be described by way of non-limiting exemplary embodiments, illustrated by the drawing in which.

DETAILED DESCRIPTION

Figure 1:
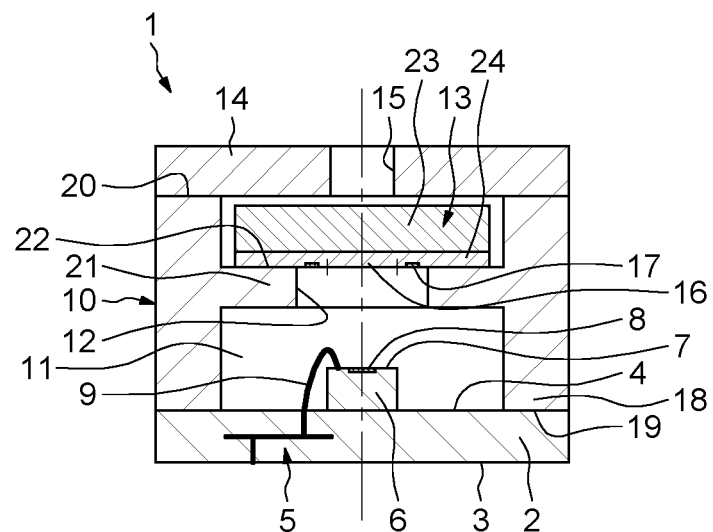
FIG. 1 shows a cross-section of an electronic device comprising an electronic chip equipped with an optical component.

An electronic device 1, illustrated in FIG. 1, comprises a carrier substrate 2, in the form of a wafer, which has a back face 3 and a front mounting face 4 and which includes an integrated network 5 of electrical connections from one wafer to the other. The carrier substrate 2 is made of an opaque material.

The electronic device 1 comprises an electronic chip 6 which is fixed onto the front face 4 of the carrier substrate 2, by means of a layer of adhesive (not shown), and which comprises an optical component 8, in its front face 7, designed to emit or to receive light radiation. The chip 6 is electrically connected to the network of electrical connections 5 for example by one or more electrical wires 9.

The electronic device 1 comprises an encapsulation cover 10 which is fixed on top of the front face 4 of the carrier substrate 2 and which bounds a chamber 11 inside of which the chip 6 is situated. The encapsulation cover 10 is made of an opaque material.

The encapsulation cover 10 has a front opening 12 situated in front of the optical component 8 of the chip 6.

The electronic device 1 comprises an optical element 13 in the form of a wafer, designed to allow light to pass, which is mounted on the encapsulation cover 10 and which covers the front opening 12 of the encapsulation cover 10.

The electronic device 1 comprises an additional mask 14 in the form of a plate, which is mounted on the encapsulation cover 10, which extends in front of the optical element 13 and which has a local opening 15 situated in front of the optical component 8 of the chip 6 in such a manner as to allow the light to pass. The additional mask 14 is made of an opaque material.

The optical element 13 has a central region 16 designed to deviate the light and a positioning pattern 17. Advantageously, the central region 16 and the positioning pattern 17 are on the back side of the optical element 13, in other words on the same side as the chip 6, the positioning pattern 17 being visually detectable through the front opening 12 of the encapsulation cover 14.

The optical axes of the optical component 8 of the chip 6 and of the central region 16 of the optical element 13 and the axis of the local opening 15 of the additional mask 14 are situated on a common optical axis, so as to obtain a correct alignment, this common optical axis being perpendicular to the front face of the chip 6 and to the carrier substrate 2.

Thus, the additional mask 14 forms an optical interface.

The local opening 15 of the additional mask 14 is smaller than the front opening 12 of the encapsulation cover 10.

According to one variant embodiment, the electronic device 1 may comprise the following arrangements.

The encapsulation cover 10 comprises a peripheral wall 18 one back edge of which 19 is fixed on top of the front face 4 of the carrier substrate 2 by means of an annular bead of adhesive (not shown). This bead of adhesive is made of an opaque material.

The additional mask 14 is fixed onto a front edge 20 of the peripheral wall 18 by means of an annular bead of adhesive (not shown).

The encapsulation cover 10 comprises an internal annular intermediate shoulder 21 which is protruding from the peripheral wall 18 and whose inside edge bounds the front opening 12.

The optical element 13 is fixed onto a front face 22 of the intermediate shoulder 21, in other words on the opposite side from the chip 6, by means of an annular bead of adhesive (not shown).

The optical element 13 comprises a base wafer 23, for example made of glass and, on a back face of this base wafer 23, in other words on the same side as the chip 6, a layer 24 of structured polymer so as to form the central region 16 designed to deviate the light and the positioning pattern 17.

Optionally, the optical element 13 comprises a front layer (not shown) designed to form a filter, for example a UV filter.

The electronic device 1 may be fabricated and installed in the following manner.

Provide, on the one hand, a carrier substrate 2 on which a chip 6 is mounted and electrically connected and, on the other hand, a prefabricated encapsulation cover 10, for example obtained by an injection process, and an optical element 13.

Using a syringe, a bead of adhesive is deposited onto the front face 22 of the shoulder 21 of the encapsulation cover 10.

By means of a transfer and positioning tool, through the front of the encapsulation cover 10, the optical element 13 is mounted onto the shoulder 21, placing the axis of the central region 16 designed to deviate the light of the optical element 13 along the axis of the front opening 12 and placing the positioning pattern 17 according to a desired position for orientation of the optical element 13 with respect to the encapsulation cover 10 along the axis of the front opening 12 or the axis of the central region 16 designed to deviate the light of the optical element 13. This operation is carried out by detecting the positioning pattern 17 via the back of the encapsulation cover 10, through the front opening 12.

Using a syringe, a bead of adhesive is deposited onto the front edge 20 of the encapsulation cover 10.

By means of a transfer and positioning tool, the additional mask 14 is mounted onto the front end edge 20 of the encapsulation cover 10 placing the axis of the local opening 15 along the axis of the front opening 12 or the axis of the central region 16 designed to deviate the light of the optical element 13.

Subsequently, a transfer and positioning tool places the encapsulation cover 10, equipped with the optical element 13 and with the additional mask 14, in a reference position established with respect to a fixed position of the carrier substrate 2 and of the chip 6 mounted on the carrier substrate 2, while implementing a detection tool designed to detect the positioning pattern 17 through the front passage 12, via the back of the encapsulation cover 10.

Then, starting from the reference position and under the effect of a suitable motion program, the transfer and positioning tool brings and mounts the encapsulation cover 10 equipped with the optical element 13 and with the additional mask 14 on top of the carrier substrate 2, in the installed position previously described.

In the case where the electronic device is placed behind a transparent wall of a device, in a position such that this transparent wall is on the same side as and at a short distance from the front face of the additional mask 14, the existence of the additional mask 14 limits the penetration, through the local opening 15 of the additional mask 14, of light radiation existing in the space between this transparent wall and the additional mask 14 towards the optical element 13 and hence towards the chamber 11 in which the chip 6 is situated.

Figure 2:
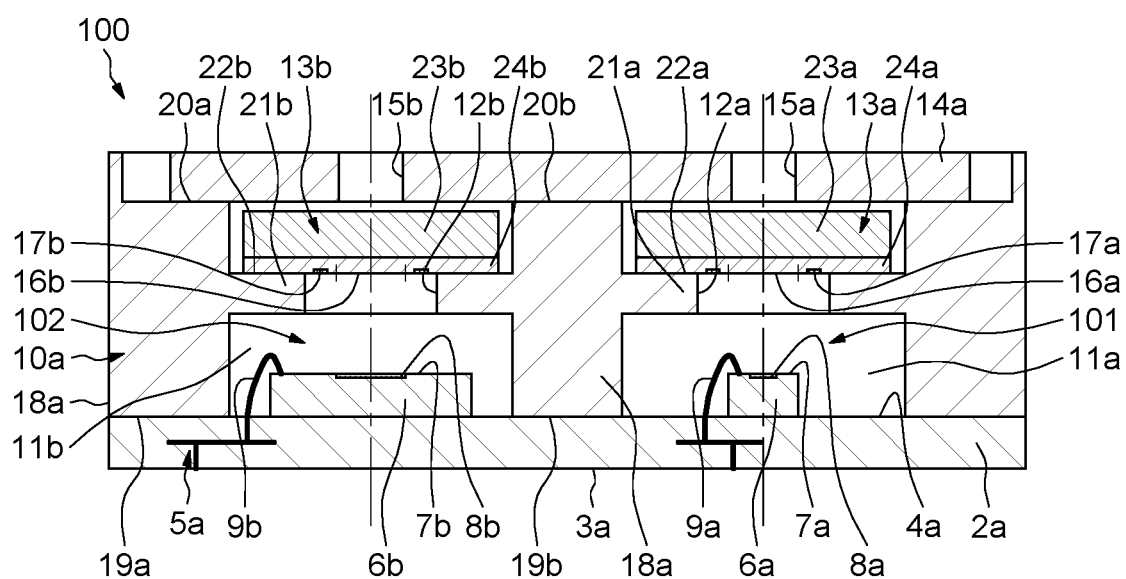
FIG. 2 shows a cross-section of an electronic device comprising two electronic chips equipped with optical components.

Referring to FIG. 2, an electronic device 100 will now be described which comprises, generally speaking, two elementary electronic devices 101 and 102 respectively equivalent to the electronic device 1 illustrated in FIG. 1, one being specifically designed to emit light towards the outside and the other being specifically designed to capture the external light.

The electronic device 100 comprises a common carrier substrate 2a which has a back face 3a and a front face 4a and which includes an integrated network 5a of electrical connections from one wafer to the other.

The electronic device 100 comprises electronic chips 6a and 6b which are fixed onto the front face 4a of the common carrier substrate 2a, by means of layers of adhesive, and which are situated at a distance from one another.

The electronic chip 6a comprises, in its front face 7a, an optical component 8a designed to emit light radiation.

The electronic chip 6b comprises, in its front face 7b, an optical component 8b designed to receive or capture light radiation.

The chips 6a and 6b are electrically connected to the network of electrical connections 5a by electrical wires 9a and 9b.

The electronic device 100 comprises a common encapsulation cover 10a which is fixed on top of the front face 4a of the carrier substrate 2a and which bounds chambers 11a and 11b inside of which the chips 6a and 6b are respectively situated.

The encapsulation cover 10a has front openings 12a and 12b respectively situated in front of the optical components 8a and 8b of the chips 6a and 6b.

The electronic device 100 comprises optical elements 13a and 13b in the form of wafers, through which the light is able to pass, which are mounted on the encapsulation cover 10a, respectively covering the front openings 12a and 12b of the encapsulation cover 10a.

The electronic device 100 comprises an additional common mask 14a in the form of a plate, which is mounted on the encapsulation cover 10a, which extends in front of the optical elements 13a and 13b and which has local openings 15a and 15b respectively situated in front of the optical components 8a and 8b of the chips 6a and 6b so as to allow the light to pass.

The local openings 15a and 15b of the additional mask 14a are respectively smaller than the front openings 12a and 12b of the encapsulation cover 10a.

The optical element 13a has a central region 16a designed to deviate the light and a positioning pattern 17a. Specifically, the central region 16a is designed to produce a multidirectional dispersion, towards the outside, of the light emitted by the emitting optical component 8a of the chip 6a, towards the outside through the local opening 15a of the additional mask 14a.

The optical element 13b has a central region 16b designed to deviate the light and a positioning pattern 17b. Specifically, the central region 16b, forming a converging optical lens, is designed to make the external light passing through the local opening 15b of the additional mask 14a converge towards the receiving optical component 8b of the chip 6b.

On the one hand, the optical component 8a of the chip 6a, the central region 16a of the optical element 13a and the local opening 15a of the additional mask 14a, belonging to the elementary device 101 and, on the other hand, the optical component 8b of the chip 6b, the central region 16b of the optical element 13b and the local opening 15b of the additional mask 14a, belonging to the elementary device 101, are respectively aligned and situated on common optical axes, as previously described.

According to one variant embodiment, the electronic device 100 may comprise the following arrangements.

The encapsulation cover 100 comprises a peripheral wall 18a and an internal partition 18b which joins two opposing sides of the peripheral wall 18a and which passes between, and at a distance from, the chips 6a and 6b and separates the chambers 12a and 12b.

The back edge 19a of the peripheral wall 18a and the back edge 19b of the internal partition 18b are fixed on top of the front face 4a of the common carrier substrate 2a by means of an annular bead of adhesive (not shown).

The additional mask 14a is fixed onto a front edge 20a of the peripheral wall 18a and a front edge 20b of the internal partition 18b by means of an annular bead of adhesive (not shown).

The encapsulation cover 101 comprises intermediate annular peripheral shoulders 21a and 21b which are protruding from the peripheral wall 18a and the internal partition 18b and whose internal edges respectively bound the front openings 12a and 12b.

The optical element 13a is fixed onto a front face 22a of the intermediate shoulder 21a, in other words at the opposite side from the chip 6a, by means of an annular bead of adhesive (not shown).

The optical element 13b is fixed onto a front face 22b of the intermediate shoulder 21b, in other words at the opposite side from the chip 6b, by means of an annular bead of adhesive (not shown).

The optical element 13a comprises a glass wafer 23a and, on a back face of this wafer 23a, in other words on the same side as the chip 6a, a layer 24a of structured polymer so as to form the central region 16a designed to diffract the light and the positioning pattern 17a.

The optical element 13b comprises a glass wafer 23b and, on a back face of this wafer 23b, in other words on the same side as the chip 6b, a layer 24b of structured polymer so as to form the central region 16b forming a convergent lens and the positioning pattern 17b.

Optionally, the optical elements 13a and 13b comprise front layers (not shown), designed to form filters, for example UV filters.

The electronic device 1 may be fabricated and installed in the following manner.

On the one hand, a common carrier substrate 2a is provided on which chips 6a and 6b are mounted and electrically connected, at a desired distance, and on the other hand, a prefabricated encapsulation cover 10a, for example obtained by an injection process.

The optical elements 13a and 13b are mounted on the shoulders 21a and 21b of the encapsulation cover 10a then the additional mask 14a is mounted on the front end edges 20a and 20b of the encapsulation cover 10a, respectively as previously described, by placing their common optical axes at a desired distance and by placing the positioning patterns 17a and 17b in desired positions.

Subsequently, a transfer and positioning tool places the encapsulation cover 10a, equipped with the optical elements 13a and 13b and with the additional mask 14a, in a reference position established with respect to a fixed position of the common carrier substrate 2a, and chips 6a and 6b mounted on the common carrier substrate 2a, while implementing a detection tool designed to detect the positioning patterns 17a and 17b through front passages 12a and 12b, in other words through the back of the encapsulation cover 10a, and under the effect of a suitable motion program.

Then, starting from the reference position and under the effect of a suitable motion program, the transfer and positioning tool brings and mounts the encapsulation cover 10 equipped with the optical elements 13a and 13b and with the additional mask 14a on top of the common carrier substrate 2a, in the installed position previously described.

Optionally, the encapsulation cover 10a could comprise a front peripheral lip surrounding and separated from the additional mask 14a.

According to one variant embodiment, the additional mask 14a could be in two parts, one being above the shoulder 21a and the other below the shoulder 21b.

According to one mode of operation, the emitter 8a of the emitting chip 6a emits light radiation towards the outside through the front opening 12a of the encapsulation cover 10a, of the optical element 13a and of the local opening 15a of the additional mask 14a. The detector 8b of the receiver chip 6b captures the external light radiation which passes through the local opening 15a of the additional mask 14a, of the optical element 13b and of the front opening 12b of the encapsulation cover 10a.

The electronic device 100 may advantageously detect the presence or the absence of an object in front of the additional mask 14a and hence constitute a proximity detector.

According to one particular exemplary embodiment, the electronic device 100 is placed behind a transparent wall of a device, in a position such that this transparent wall is on the same side as and at a short distance from the front face of the additional mask 14a.

The existence of the additional mask 14a limits the penetration, through the local opening 15b of the additional mask 14a, of light radiation potentially existing in the space between this transparent wall and the additional mask 14*a* and coming from the emitting chip 6*a*, towards the optical element 13*b* and hence towards the chamber 11 in which the receiving chip 6*b* is situated.

Thus, the receiving chip 6*b* is protected against the radiation from the emitting chip 6*a*, behind the transparent wall of the device.

The electronic device may advantageously be installed inside a mobile telephone or an electronic tablet, behind a transparent wall.

The invention claimed is:

1. A method of fabricating an electronic device, comprising:
    providing a carrier substrate having a front face on which is mounted at least one electronic chip comprising an optical component;
    providing an encapsulation cover having a front opening;
    mounting an optical element through which light is able to pass on the encapsulation cover in front of the front opening;
    mounting an additional mask on the encapsulation cover in front of the optical element, wherein the additional mask has a local opening;
    mounting the encapsulation cover, with the optical element and the additional mask mounted thereon, on top of the front face of the carrier substrate to enclose the at least one electronic chip situated in a chamber bounded by the encapsulation cover and with the optical element arranged in front of the optical component, wherein optical axes of the optical component and the optical element are aligned with an axis of the local opening of the additional mask;
    wherein mounting the encapsulation cover comprises:
        placing the encapsulation cover in a reference position;
        detecting a positioning pattern located on the optical element between a central region and an edge of the front opening of the encapsulation cover, through the front opening with respect to a position of the carrier substrate;
        starting from the reference position, moving the encapsulation cover on top of the carrier substrate to a mounting position; and
        mounting the encapsulation cover at the mounting position to the top of the carrier substrate.

2. The method according to claim 1, wherein moving the encapsulation cover is performed in response to execution of a motion and mounting program.

3. A method of fabricating an electronic device, comprising:
    providing a carrier substrate having a front face on which is mounted at least one electronic chip comprising an optical component;
    providing an encapsulation cover having a front opening;
    mounting an optical element through which light is able to pass on the encapsulation cover in front of the front opening;
    mounting an additional mask on the encapsulation cover in front of the optical element, wherein the additional mask has a local opening;
    mounting the encapsulation cover, with the optical element and additional mask mounted thereon, on top of the front face of the carrier substrate to enclose the at least one electronic chip situated in a chamber bounded by the encapsulation cover and with the optical element arranged in front of the optical component, wherein optical axes of the optical component and the optical element are aligned with an axis of the local opening of the additional mask;
    wherein mounting the encapsulation cover comprises:
        placing the encapsulation cover in a reference position;
        detecting a positioning pattern located on the optical element between a central region and an edge of the front opening of the encapsulation cover, through the front opening with respect to a position of the at least one electronic chip mounted on the carrier substrate;
        starting from the reference position, moving the encapsulation cover on top of the carrier substrate to an aligned position; and
        mounting the encapsulation cover at the aligned position to the top of the carrier substrate.

4. The method according to claim 3, wherein moving the encapsulation cover is performed in response to execution of a motion and mounting program.

* * * * *